United States Patent [19]

Kojima

[11] Patent Number: 5,027,429

[45] Date of Patent: Jun. 25, 1991

[54] FREQUENCY MODULATOR UTILIZING FREQUENCY SYNTHESIZER

[75] Inventor: Tatsuru Kojima, Tokyo, Japan

[73] Assignee: NEC Corporation, Tokyo, Japan

[21] Appl. No.: 393,179

[22] Filed: Aug. 14, 1989

[30] Foreign Application Priority Data

Aug. 12, 1988 [JP] Japan .................. 63-201276

[51] Int. Cl.⁵ .............................. H04B 1/04
[52] U.S. Cl. ................... 455/113; 455/119; 455/264; 332/127
[58] Field of Search ............... 455/164, 165, 182, 183, 455/259, 260, 264, 316, 317, 113, 119; 332/127; 328/14

[56] References Cited

U.S. PATENT DOCUMENTS

| | | | |
|---|---|---|---|
| 2,298,409 | 10/1942 | Peterson | 370/69.1 |
| 2,640,193 | 5/1953 | Carter et al. | 370/69.1 |
| 4,117,422 | 9/1978 | Hunt | 332/127 |
| 4,348,770 | 9/1982 | Ito | 455/164 |
| 4,477,781 | 10/1984 | Ruess, Jr. | 330/124 R |
| 4,501,019 | 2/1985 | Matsukura | 455/113 |
| 4,503,402 | 3/1985 | Englund, Jr. | 332/127 |
| 4,618,831 | 10/1986 | Egami et al. | 330/124 R |
| 4,660,002 | 4/1987 | Iijima et al. | 455/113 |
| 4,721,927 | 1/1988 | Aota et al. | 455/113 |

FOREIGN PATENT DOCUMENTS 187903  8/1988  Japan ................... 330/295

OTHER PUBLICATIONS

Comsat Techanical Review, A. Standing, vol. 5, No. 2, Fall 1975, pp. 355-366.

Primary Examiner—Reinhard J. Eisenzopf
Assistant Examiner—Lisa Charonel
Attorney, Agent, or Firm—Sughrue, Mion, Zinn, Macpeak & Seas

[57] ABSTRACT

A frequency modulator utilizing a frequency synthesizer is disclosed. The modulator is especially useful in a mobile radio communication apparatus. The synthesizer includes a phase locked loop made up of a voltage controlled oscillator (VCO), a programmable frequency divider, a phase comparator, a second frequency divider, a reference oscillator, and a low-pass filter. When a channel control signal is input to the programmable frequency divider, the modulator sensitivity of the voltage controlled oscillator is undesirably deviated according to the channel selection. An increase of the modulator sensitivity due to an increase of the oscillation frequency is compensated for by adding a simple FET to the VCO bias circuit. A control voltage from the phase locked loop is applied to both the voltage controlled oscillator and its bias circuit. The modulator can compensate for changes in sensitivity over a wider frequency bandwidth without expanding the circuit elements of the bias circuit therefore making the modulator especially useful for portable use.

3 Claims, 2 Drawing Sheets

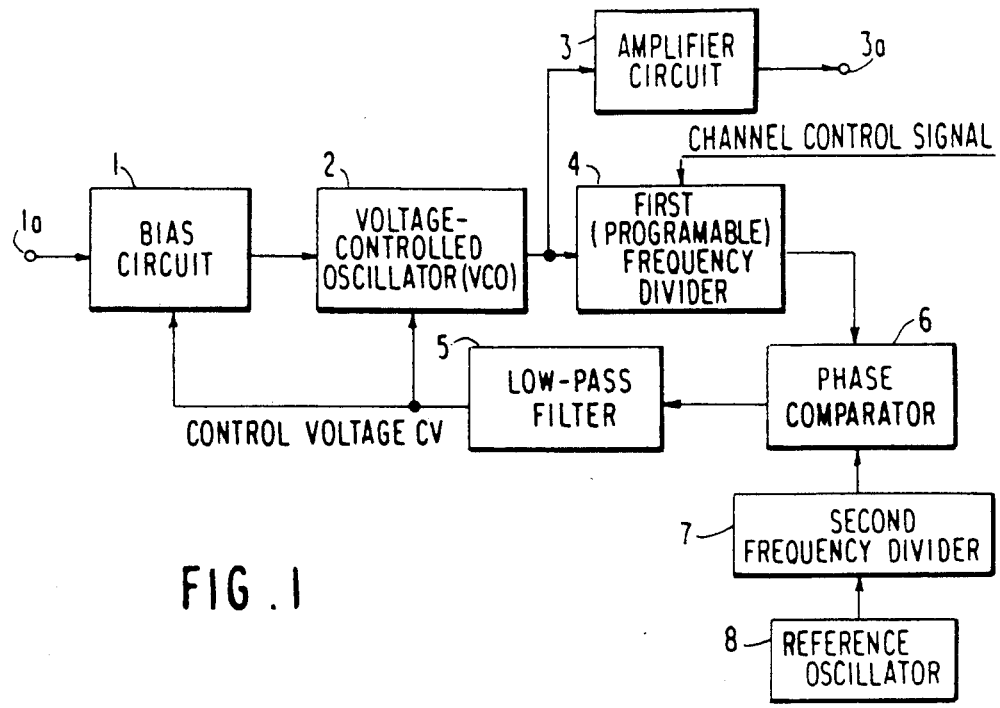
FIG. 1
FIG. 2
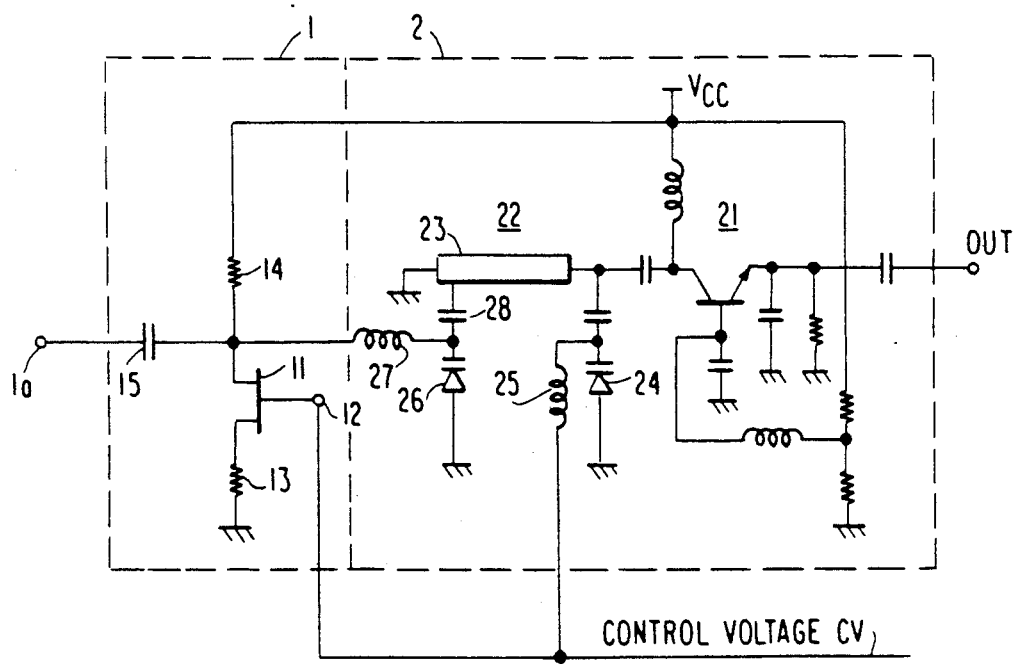

$$C = \frac{C_1 C_2}{C_1 + C_2}$$

$C_1$ : CAPACITANCE OF CAPACITOR 28

$C_2$ : CAPACITANCE OF VARIABLE CAPACITOR 26

$C$ : SUM CAPACITANCE $\Delta C > \Delta C'$

FREQUENCY MODULATOR UTILIZING FREQUENCY SYNTHESIZER

BACKGROUND OF THE INVENTION

The present invention relates to a frequency modulator utilizing a frequency synthesizer, which is applied to a mobile radio communication apparatus.

A conventional frequency synthesizer for a frequency modulator of this kind comprises a voltage controlled oscillator (VCO), a programmable frequency divider, a reference oscillator, a phase detector (comparator) and a phase locked loop connecting them. With this circuit configuration, an input modulation signal from an external source is applied to a variable capacitance diode (variable capacitor) contained in the VCO to generate a frequency-modulated signal. Particularly, for a mobile radio communication use, an output frequency of the VCO is changed according to control of a channel selection and change of the VCO output frequency is performed by changing a frequency-dividing factor of the programmable frequency divider.

When such frequency synthesizer is applied to a mobile radio communication apparatus, it is well known in the field that modulation sensitivity is undesirably deviated according to the channel selection, i.e., the VCO output frequency. For example, when, in order to generate a higher carrier frequency, a control voltage to be applied to the VCO is boosted, the modulation sensitivity becomes higher. Namely, since the control voltage applied to the VCO corresponds to a reversed voltage applied to the variable capacitor in the VCO, capacitance of the variable capacitor becomes reduced when the control voltage becomes high. Therefore, capacitance change due to the level of the input modulation signal becomes more efficient than that due to the control voltage.

Conventionally, the modulation sensitivity change is compensated by controlling a level of an input modulation signal according to channel selection. Such technique is disclosed in U.S. Pat. No. 4,501,019 "FREQUENCY MODULATION TRANSMITTER" issued on Feb. 19, 1985 and assigned to the applicant of the present invention.

However, according the forementioned conventional technique, there is the following disadvantage. When an oscillation frequency band becomes wider, i.e., the number of channels used for mobile radio communication becomes increased, it is necessary to enlarge the circuit configuration for compensating the corresponding wide modulation sensitivity change. Therefore, a frequency synthesizer becomes more complicated.

SUMMARY OF THE INVENTION

It is therefore an object of the present invention to provide a frequency modulator utilizing a frequency synthesizer capable of compensating modulation sensitivity change by adding only a simple circuit part to the conventional frequency synthesizer.

According to the present invention, there is provided a frequency modulator utilizing a frequency synthesizer comprising a voltage controlled oscillator (VCO), a programmable frequency divider, a reference oscillator, a phase comparator and a phase locked loop, the VCO including a first variable capacitor receiving the control voltage from the phase comparator and a second variable capacitor receiving an input modulation signal, further comprising a bias circuit for controlling a bias to be supplied to the second variable capacitor in accordance with the control voltage delivered from the phase comparator. According to the present invention, undesirable change of the modulation sensitivity due to difference of the oscillation frequency is compensated by controlling the reverse bias to be applied to the second variable capacitor receiving the input modulation signal depending on the frequency control voltage for the VCO.

BRIEF DESCRIPTION OF THE DRAWINGS

FIG. 1 is a block diagram of an embodiment according to the present invention;

FIG. 2 shows a detailed circuit configuration of a bias circuit and a voltage controlled oscillator shown in FIG. 1;

DESCRIPTION OF THE PREFERRED EMBODIMENTS

Figure 3:
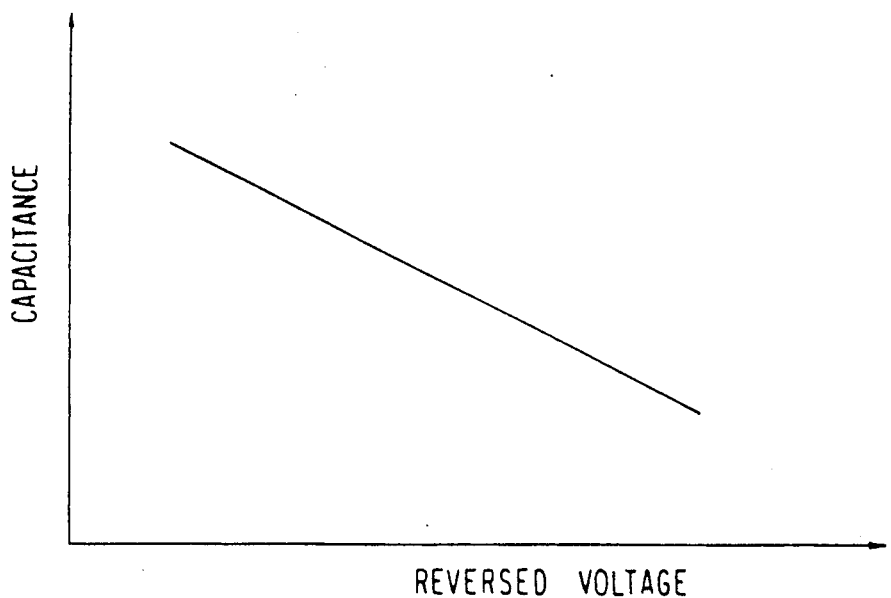
FIG. 3 is a diagram illustrating capacitance change of a variable capacitor in accordance with a reversed bias to be applied to the variable capacitor.

Referring to the accompanying drawings, an embodiment of the present invention will subsequently be described. FIG. 1 is a block diagram of the embodiment according to the present invention. FIG. 2 is a block diagram of detailed circuitry of FIG. 1, including a bias circuit 1 and a voltage-controlled oscillator 2.

The embodiment of the present invention, as shown in FIG. 1, comprises the bias circuit 1 for applying a bias voltage to an input modulation signal given via a modulation input terminal 1a, a voltage-controlled oscillator (VCO) 2 having a variable capacitance diode (variable capacitor) for receiving the output of the bias circuit 1, an amplifier circuit 3 for amplifying the output signal of the (VCO) 2 to deliver a synthesizer output signal to an output terminal 3a, a first frequency divider (programmable frequency divider) 4 for frequency-dividing the output of the VCO 2 in accordance with a channel control signal, a reference oscillator 8 for producing a reference frequency signal, a second frequency divider 7 for dividing the output of the reference oscillator 8, a phase comparator 6 for comparing the phase of the output of the first frequency divider 4 and the phase of the output of the second frequency divider 7, and a low-pass filter 5 for receiving the output of the phase comparator 6 to deliver a control voltage to the VCO 2. Further, according to the present invention, the control voltage from the low-pass filter 5 is also applied to the bias circuit 1 to compensate for a modulation sensitivity change.

As shown in FIG. 2, the VCO 2 comprises an oscillator part 21 and a variable capacitance part 22. The variable capacitance part 22 includes a resonance element (strip-line in this case) 23, a variable capacitor 24 receiving the control voltage through a choke coil 25 from the low-pass filter 5 (FIG. 1) and another variable capacitor 26 receiving the input modulation signal through a choke coil 27. Further, the bias circuit 1 featuring the present invention includes a field-effect transistor (FET) 11 having a gate terminal 12 for receiving the control voltage delivered from the low-pass filter 5, a source electrode connected to a common potential (earth voltage) via a resistor 13, and a drain electrode connected via a resistor 14 to a power supply Vcc and also connected via the choke coil 27 in the VCO 2 to a cathode of a variable capacitor 26 in the VCO 2 for the frequency modulation of the VCO 2, and a capacitor 15 inserted between the terminal 1a and the drain electrode of the FET 11.

Figure 4:
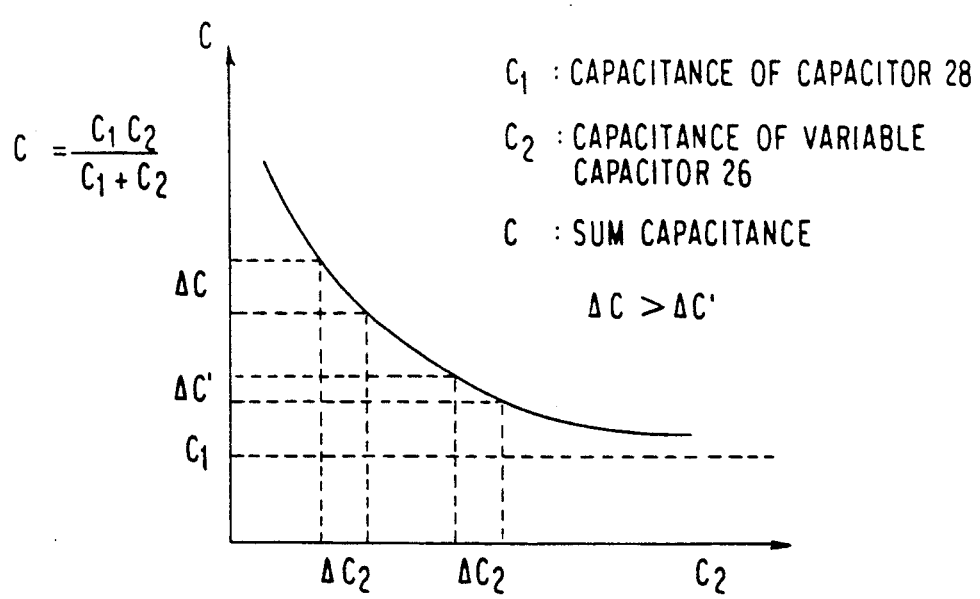
FIG. 4 is a diagram illustrating total capacitance change in a variable capacitance circuit contained in the voltage controlled oscillator.

The operation of the bias circuit 1 featuring the present invention will subsequently be described. The control voltage CV from the low-pass filter 5 is applied to the gate of the n-channel FET 11 and the input modulation signal from the terminal 1a is connected via the capacitor 15 to the drain of the FET 11. Thus, the input modulation signal is superposed on DC bias from the drain of the FET 11 and applied to the variable capacitor 26 for the frequency modulation of the VCO 2. In this case, when the oscillation frequency of the VCO 2 becomes high, the control voltage CV applied to the gate of the FET 11 becomes high. Further, if, in this case, the resistance of the resistors 13 and 14 is so selected as to saturate the drain current of the FET 11, the potential of the drain of the FET 11, i.e., the DC bias, accordingly decreases by $R \cdot \Delta I_{PS}$ (the product of the increase in the drain current $\Delta I_{PS}$ and the resistance R of the resistor 14). As the DC bias decreases, the capacitance of the variable capacitor 26 increases as shown in FIG. 3. Since the modulation sensitivity is determined by the change of the sum of capacitances of the variable capacitor 26 and a capacitor 28 serially connected to the variable capacitor 26 relative to the change of the modulation signal level, the change of the total capacitance decreases as the capacitance of the variable capacitor 26 increases as shown in FIG. 4 and, thus, the modulation sensitivity also decreases. In FIG. 4, $C_1$ and $C_2$ correspond to the capacitances of the capacitor 28 and the variable capacitor 26, respectively, and C corresponds to the sum capacitance. This makes it possible to compensate for the increase of the modulation sensitivity due to an increase of the oscillation frequency.

In this case, the oscillation frequency is subject to deviate at that time because the total capacitance changes. However, since the sensitivity due to the variable capacitor 24 for a phase locked loop is much greater than the modulation sensitivity due to the variable capacitor 26, the phase locked loop is sufficiently locked and the frequency deviation due to the total capacitance change does not appear.

A transistor may be used in place of the FET for the same operation, but a reference leak resulting from control voltage leakage will appear because the transistor requires a base current and this badly affects the performance of the synthesizer.

As set forth above, according to the present invention, the modulation sensitivity change due to the oscillation frequency change can be compensated by only adding the FET to the bias circuit so that a circuit having a large number of parts necessary to the prior art circuit configuration can be dispensed. Consequently, the present invention has the effect of not only reducing cost but also improving package efficiency.

What is claimed is:

1. A frequency modulator utilizing a frequency synthesizer comprising:
   a voltage controlled oscillator having a variable capacitor for generating a frequency-modulated signal, said variable capacitor receiving an input modulation signal;
   a programmable frequency divider for frequency-dividing the frequency-modulated signal delivered from said voltage controlled oscillator;
   a reference oscillator for generating a reference signal;
   a phase comparator for comparing phases of the output of said programmable frequency divider and said reference signal to produce a control signal of said voltage controlled oscillator; and
   bias means for controlling a bias of said variable capacitor contained in said voltage controlled oscillator in response to said control signal delivered from said phase comparator.

2. A frequency modulator utilizing a frequency synthesizer comprising a voltage controlled oscillator for generating a frequency-modulated signal, a programmable frequency divider for frequency dividing the frequency-modulated signal delivered from said voltage controlled oscillator, a reference oscillator for generating a reference signal, a phase comparator for comparing phases of the output of said programmable frequency divider and said reference signal to produce a control voltage, and a phase locked loop for supplying said control voltage to said voltage controlled oscillator, said voltage controlled oscillator including a first variable capacitor receiving said control voltage and second variable capacitor receiving a modulation signal to generate said frequency modulated signal, wherein said frequency synthesizer further comprises bias means for controlling a bias of said second variable capacitor in accordance with the control voltage delivered from said phase comparator.

3. A frequency modulator as claimed in claim 2, wherein said bias means includes:
   an input terminal for receiving said modulation signal,
   a first resistor with one end connected to a power supply,
   a second resistor with one end connected to a common potential,
   a field-effect transistor inserted between the respective other ends of said first and second resistors, a gate of said field-effect transistor receiving said control voltage, and
   a capacitor connected between said input terminal and the connection of the other end of said first resistor and said field-effect transistor, whereby said bias for said second variable capacitor is delivered from said connection.

* * * * *